Dec. 10, 1963 C. R. SMALLMAN 3,114,136

MULTI-STABLE ELECTRICAL CIRCUIT

Filed Dec. 5, 1957

United States Patent Office 3,114,136
Patented Dec. 10, 1963

3,114,136

MULTI-STABLE ELECTRICAL CIRCUIT

Carl Russell Smallman, Lexington, Mass., assignor to Arthur D. Little, Inc., Cambridge, Mass., a corporation of Massachusetts Filed Dec. 5, 1957, Ser. No. 700,904
8 Claims. (Cl. 340—173.1)

This invention relates to an electrical circuit having a plurality of stable current conducting conditions and more particularly to a circuit in which current is carried by superconductive elements.

Various superconductive materials are known which are capable of a change of state from one of finite electrical resistance to one of zero resistance. For example, a body of lead cooled to 7.2 degrees Kelvin suddenly drops to zero resistance. The temperature at which superconductive materials undergo such transition is dependent on the magnetic field about the material. The critical temperature of 7.2° K. for lead supposes a zero magnetic field. As the field increases toward approximately 800 oersteds the transition temperature drops toward zero, and at intermediate temperatures there is a critical field which, if exceeded, will cause the lead body to change from superconducting state to a state of finite resistance. Thus for any given temperature below critical temperature there is a predetermined critical or threshold value of magnetic field above which lead undergoes transition from the superconducting state, and the transition between superconduction and finite resistance can be effected by varying the magnetic field respectively below and above the predetermined value of magnetic field. Above the critical temperature no reduction of field can restore superconduction. Herein the term superconductive is used to designate the capability of the body to change between the above-mentioned states, while superconducting or superconduction designates the zero resistance state.

A body of superconductive material acts as a gate when controlled by a magnetic field. That is, if the gate body is in superconducting state and is conducting electrical current, a magnetic field above the aforesaid predetermined value will cause the gate body to impede the current.

According to the invention a multi-stable electrical circuit comprises current-supply means and current-collection means, superconductive means forming at least two paths between said current means, means for impeding current in one of said paths, and current detecting means in the magnetic field of at least one of said paths, said paths being magnetically independent of each other, whereby said circuit may assume a condition in which current flows in both paths or, when current is impeded in one path, a condition in which current flows in another path, said detecting means being influenced by a change between said conditions. By current-supply and current-collection means is meant a point, junction, conductor or electrical component through which current is supplied or collected. Current means refers to both of the supply and collection means. As is well known, any current carrying path establishes a magnetic field around it. This field may be detected as described more fully hereinafter.

It has been demonstrated that a persistant current can be established in a closed loop of superconductive material while in superconducting state. Establishing persistent current is used to mean that electrical or magnetic energy, or both, are stored in the superconducting loop apparently in the form of a steady electrical current which establishes a commensurate fixed, magnetic field. Present physical measuring methods show no reduction of the apparent persistent current in a superconducting loop over a period of years, and indicate that the energy so stored is released when persistent current is quenched.

Further according to the invention a novel circuit for establishing persistent current comprises the aforesaid two paths formed in a closed superconductive loop, the circuit including an interruptive current connection to the current means for the paths, whereby when the two paths are unimpeded and current is flowing in the inductive means of one path, interruption of said current connection causes said inductive means to establish a persistent current condition in said loop, the aforesaid current detecting means being responsive to a change in said current.

For the purpose of illustration typical embodiments of the invention are shown in the accompanying drawings in which.

Figure 1:
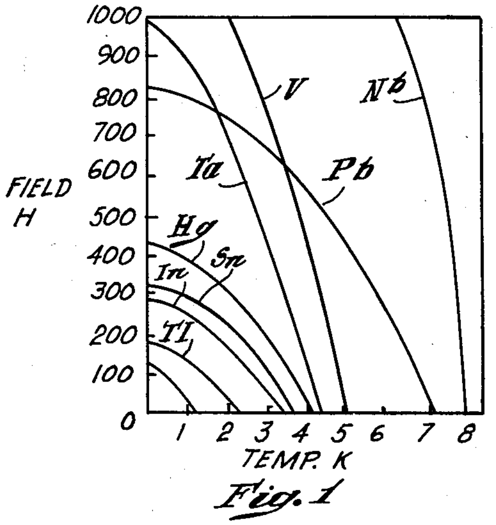
FIG. 1 is a plot of transition temperature against magnetic field applied to several superconductive elements.

As shown in FIG. 1 various elements are capable of superconduction, depending upon the temperature and magnetic field of their environment. In this figure are shown the transition curves of aluminum (Al), thallium (Tl), indium (In), tin (Sn), mercury (Hg), tantalum (Ta), vanadium (V) lead (Pb) and niobium (Nb). For each of these elements the curve is a plot of the transition temperature as a function of the applied magnetic field. Below the curve the element is superconducting, and above the curve the element has a finite resistance usually less than the resistance at room temperature.

Figure 2:
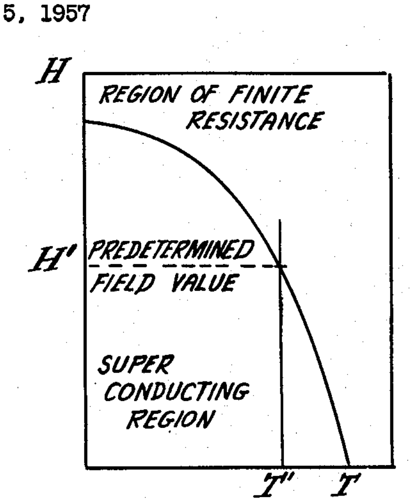
FIG. 2 is a similar plot illustrating transition of a superconductive body between states.

As shown in FIG. 2 the transition curve is the boundary between the superconducting region and finite resistance region of a given element. For a given temperature environment T′ there is a predetermined magnetic field value H′ at the transition point or zone. Increasing the field above the predetermined value H′ destroys superconduction, while reducing the field below the predetermined value establishes superconduction.

Figures 3, 4, 5, 6, 7, 8, 9, 10:
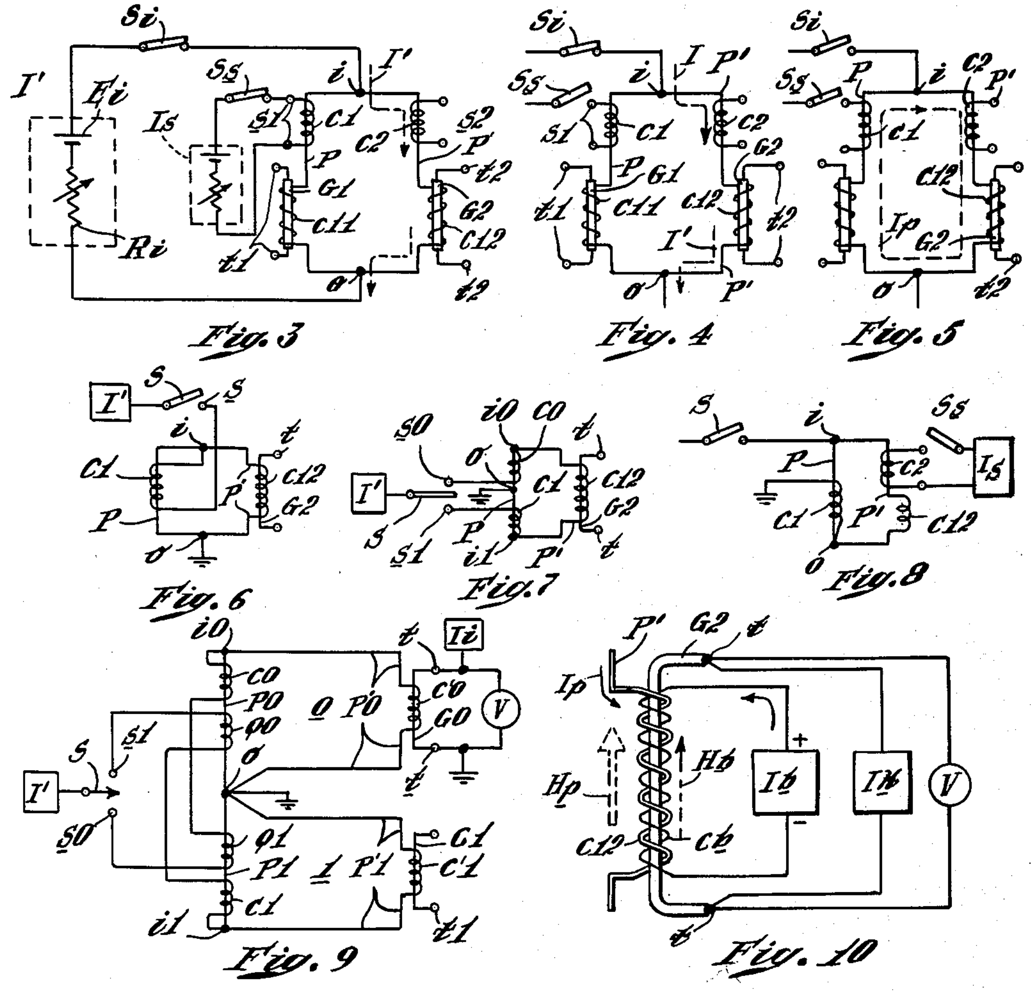
FIG. 3 is a schematic diagram of a bistable superconductive circuit and its power supply.
FIGS. 4 and 5 are diagrams showing the operation of the circuit of FIG. 3.
FIGS. 6 to 9 are schematic diagrams of related superconductive circuits.
FIG. 10 is a schematic diagram showing means for detecting persistent current.

In FIGS. 3 to 5 is shown a bistable superconductive circuit comprising a current input junction *i* and a current output junction *o* between which are connected two superconductive wires or paths P and P′. A substantially constant current is applied between the terminals *i* and *o* by a primary current source I′ which typically comprises a voltage source E*i* and a variable resistance R*i*, which is large compared to the resistance of the bistable circuit P—P′. The primary current source I′ is connected to the input junction *i* by current interrupting means S*i*, which is shown as a simple single pole, single throw switch, but which may be any means capable of interrupting current to the input junction *i*.

A second current source I*s* supplies a control or set current through set terminals *s*1 and a set switch S*s* to a control coil C1 embracing the wire P forming one path of the bistable circuit. The paths P and P′ include output control coils C11 and C12 respectively embracing superconductive gates G1 and G2 which control current in external circuits (not shown) connected respectively to terminals *t*1 or *t*2. A like secondary source is connected through a switch to set terminals *s*2.

The operation of the bistable circuit of FIGS. 3–5 is as follows: When the primary current source I′ is connected by the switch S*i* to the current input junction *i*, the primary current I′ will divide in some manner between the two paths P and P′, unless a secondary switch Ss is closed. If switch Ss to terminal s1 is closed, a control current will flow through the set coil C1 applying a magnetic field to the wire of path P, thereby raising its field above the predetermined field value illustrated in FIG. 2 and driving the wire P from superconducting state to a state of finite resistance. Current flowing between the input i and the output o will have a choice of a resistive path P and a non-resistive path P′ and will be diverted wholly into the non-resistive path P′ as shown by the broken line arrow in FIG. 3. The increase of current in the selected path P′ will then increase the current through the output control coil C12 to a value above the predetermined field of the output gate G2 and will thereby introduce a finite resistance between the terminals t2. The potential drop across this resistance may be measured by an indicating instrument such as a voltmeter or may be used to control other superconductive circuits. If at the beginning of the sequence shown in FIGS. 3 to 5 a set for terminals s2 of control coil C2 embracing path P′ had been closed, destroying the superconductivity of path P′, the primary current I′ would be diverted to path P, and subsequently a counterclockwise persistent current would be established in the loop P—P′ if, first, the set switch for terminals s2 is opened thus restoring superconductivity to path P′ and, second, switch Si is opened thus disconnecting the loop P—P′ from the external current source I′. Thus the circuit of FIGS. 3 to 5 has five stable conditions, (1) current split between paths P and P′, (2) all current in path P, (3) all current in path P′, (4) clockwise persistent current, or (5) counterclockwise persistent current. A detecting device such as is explained with reference to FIG. 10, differentiates between clockwise and counterclockwise current to control other superconductive circuits.

Alternatively, if the other set switch applies set current through terminals s2 and control coil c2 the primary current I′ will be diverted to path P thereby destroying superconduction in gate G1. As one example of the superconductive material used in the bistable circuit, the alternate paths P and P′ may be lead (Pb) wire approximately 0.005 inch in diameter; the set coil C1 may comprise one hundred turns of 0.003 inch diameter niobium wire close wound on the lead wire P; and the gate G1 may be a length of tantalum wire 0.009 inch in diameter on which one hundred turns of the lead wire are wound to form the output coil C11. The primary current I′ for such a circuit may be approximately 1.0 ampere, and the secondary current Is, 5.0 amperes.

The establishment of persistent current is illustrated in FIGS. 4 and 5. With the primary current I′ established in path P′, the set switch Ss is opened removing current from the set coil C1 and allowing path P to return to superconducting or non-resistive state. While the current applied to the input junction i now has a choice of two non-resistive paths, there is no IR drop between the input junction i and output junction o across the two paths P and P′. Therefore, there is no tendency for the primary current I′ established in path P′ to split, and it will continue to flow in path P′ as in FIG. 3. However, if the primary current switch Si is now opened, a path through the primary current source I′ and the selected path P′ no longer exists. The induced field stored in the output coil C12 partially collapses and in doing so tends to maintain the current flowing therethrough. Since the alternate path P provides a complete superconducting circuit with the path P′ Ip current is established in the loop P—P′ which persists in the absence of resistance.

By a proper selection of the primary current I′ the persistent Ip may be used to control the gate G2 within the field of the output coil C12, and thus the persistent current loop may be used as a memory unit which may be set either in a persistent current state or an inactive state, representing binary digit 1 or binary digit 0. The loop P—P′ may be reset by closing the set switch Ss thereby applying a control field to path P and establishing in that path a finite resistance which attenuates the persistent current Ip.

As shown in FIGS. 6 to 9, the primary current I′ can be used both for current supply and for setting, thus eliminating the secondary current supply Is and set switch Ss.

In FIG. 6 the input control winding C1 is connected between the primary current switch contact s and the current-supply junction i in series with the current-collection junction o. Thus, when the supply switch S is closed current flows through the input control coil C1 quenching the superconductive path P, so that all primary current is diverted to the alternate path P′. Primary current through the output coil C12 controls the output means G2. The output coil C12 is preferably of a higher inductance value than that of the input coil C1, so that the time in which its field collapses after interruption of the primary current is substantially longer than the time in which the field of the coil loses control of path P. Consequently when the supply switch S is opened, interrupting the primary current, path P becomes superconducting while the field coil C12 is still collapsing. The still collapsing field of coil C12 then induces a current in a wholly superconducting loop P—P′, and thereby establishes a clockwise persistent current in the loop. This persistent current may be detected in any one of the ways described herein. If the output means G2 is a length of magnetoresistive wire, such as bismuth, the difference between no current, full primary current and a lesser persistent current is indicated by a difference in the resistance of the wire G2. Such a circuit is useful as a memory device, and in the testing of the welds at junctions i and o. If any resistance exists in the welds, the persistent current will be attenuated in a finite time.

In FIG. 7 is illustrated a similar circuit in which both clockwise and counterclockwise persistent current may be established with only one current supply and switch. The primary supply switch S has two contacts s0 and s1 connected respectively through set coils C0 and C1 to the junctions i0 and i1, each of which can act as current-supply means. When contacts s0 is closed, primary current flows through coil C0, making resistive the path between terminals i0 and o, and diverting current through the output coil C12 and the path between terminals i1 and o. When contact s0 is then opened, clockwise persistent current is established as described with respect to FIG. 6. If contact s1 is closed, then opened, a counterclockwise current is established in a similar way. The direction of persistent current flow may be detected by a superconductive gate to which a biasing field is applied as described with reference to FIG. 10.

As shown in FIG. 8 established persistent current in any of the circuits of FIGS. 6 to 9 may be quenched by application of secondary current Is through a switch Ss.

In FIG. 9 is shown a bistable circuit which generally comprises two stages 0 and 1 of the circuit of FIG. 6. Each circuit 0 (or 1) includes first and second superconducting paths P0 and P′0 (or P1, P′1), an input terminal i0 (or i1), an input coil C0 (or C1), an output coil C′0 (or C′1) and an output gate G0 (or G1). In series with the input coil C0 for path P0 of stage 0 is a quenching coil Q1 embracing the corresponding path P1 of stage 1. Conversely, the input coil C1 of path P1 is in series with a like quenching coil Q0 embracing path P0. Thus each of the paths P0 and P1 are embraced by two coils.

Either, but not both, of the loop P0—P′0 of stage 0 or the loop P1—P′1 of stage 1 may be set in persistent current condition by connecting the primary current supply I′ to set terminal s0 or s1 respectively. If terminal s0 is connected, current flowing through coils Q1 and C0 quenches current through both paths P0 and P1, and the current continuing through the current-supply junction i0 develops a magnetic field in the output coil C′0 of stage 0. Thus, if stage 1 had previously been in persistent current condition, such current would be quenched. However, no current flows through output coil C'1 of stage 1. Then, when terminal *s*0 is opened coil C0 loses control of path P0 before the field of coil C'0 collapses and, as described with reference to FIG. 6, a persistent current is established in loop P0—P'0 of stage 1. Such persistent current may be sufficient to change gate G0 from superconducting, zero-resistance state to a state of finite resistance. A constant current source I*i*, like the primary source I', will establish a finite IR drop between the output terminals *t* of gate G0, which may be detected by a voltmeter V.

Similarly, by throwing switch S to contact *s*1, an existing persistent current in stage 0 will be quenched and a persistent current established in stage 1. Thus the circuit of FIG. 9 serves as a memory unit, having alternative persistent current conditions, and its arrangement insures that only one of the conditions can exist at one time.

In FIG. 10 is shown means for detecting the existence of persistent current in any of the circuits described above, and particularly the circuit of FIG. 7. In FIG. 10, the gate wire G2 of tantalum, for example, is wound between its terminals *t* with two lead control coils C12 and C*b*. Coil C12 is in one length P' of the superconducting loop P—P' which carries either clockwise or counterclockwise current. The number of windings of coil C12 and the current value of the primary source I' are selected such that, with reference to FIG. 1, the magnetic field H*p* due to persistent current I*p* is less than critical, it being assumed that the persistent current is approximately one-half that of the primary source. Coil C*b* is connected in series with a constant current source I*b* which supplies a bias current to the gate G2. The windings C*b* and the value of bias current I*b* are selected according to the graph of FIG. 1 such that a steady magnetic field H*b* is applied to the gate G2, the strength of the field H*b* alone being less than predetermined critical value but sufficient when combined in the same polarity with the persistent current field H*p* to exceed critical field value. For example, the persistent current established by a primary current of 300 milliamperes through one hundred turns of 0.003 inch lead wire close wound on an 0.009 inch tantalum wire can produce a field greater than one-half critical but less than critical. A like bias coil supplied with a current of 300 milliamperes will produce approximately the same field.

As shown in FIG. 10, the output coil C12 is wound in the same hand as the bias coil. With the bias current flowing downwardly in coil C*b* and persistent current flowing clockwise in loop P—P' of FIG. 7 (downwardly in path P'), the two resulting magnetic fields H*b* and H*p* will reinforce each other and raise the field applied to the gate G2 above critical, placing the gate in resistive state. A constant current from a source I*k* will produce an IR drop across the gate which is indicated by a voltmeter V.

If, however, the persistent current in loop P—P' is counterclockwise, the magnetic fields are opposed, and the net field is negligible, thus permitting the gate G2 to remain in superconducting, non-resistive state, and cause a different indication on the voltmeter V.

While I have shown various persistent current and multistable circuits, it should be understood that the above-described embodiments of the invention are shown for the purpose of illustration only and that the present invention includes all modifications and equivalents of the invention defined in the claims.

I claim:

1. An electrical circuit comprising superconductive means forming at least two, magnetically independent current carrying paths, current input and output terminals for said paths, one of said paths forming inductive output control means, and input means for impeding current in the other of said paths, said input means being connected in series with one of said terminals, whereby, when current is supplied to said terminals, current through said input means impedes current in said other path thereby diverting current to the output means of said one path, and said output means having a higher inductance than said input means, so that, when current to said current means and input means is interrupted, said output means establishes a persistent current through both of said paths.

2. An electrical circuit comprising superconductive means forming at least two, magnetically independent current carrying paths, current input and output terminals for said paths, one of said paths forming inductive output control means, input means for impeding current in the other of said paths, said input means being connected in series with one of said terminals, whereby, when current is supplied to said terminals, current through said input means impedes current in said other path thereby diverting current to the output means of said one path, and said output means having a higher inductance than said input means, and an interruptable current connection to one of said terminals so that, when current to said terminals and input means is interrupted, said output means establishes a persistent current through both of said paths.

3. An electrical circuit comprising current input and output terminals, superconductive means forming a closed loop providing at least two current carrying paths between said terminals, one of said paths forming inductive output means, input means for impeding current in the other of said paths, said input means being connected in series with one of said terminals, said paths being magnetically independent of each other so that said circuit may assume a condition in which current flows in both paths, an interruptive current connection to one of said terminals, whereby current may be supplied through said terminals and input means thereby to impede current in said other path and divert current to said one path, and said output means having a greater time constant than said input means, whereby when said current is interrupted said input means ceases to impede current in said other path, and thereafter said output means establishes a persistent current through both paths in said loop.

4. An electrical circuit comprising current input and output terminals, superconductive means forming a closed loop providing at least two current carrying paths between said terminals, one of said paths forming inductive output means, input means for impeding current in the other of said paths, said input means being connected in series with one of said terminals, said paths being magnetically independent of each other so that said circuit may assume a condition in which current flows in both paths, an interruptive current connection to one of said terminals, whereby current may be supplied through said terminals and input means thereby to impede current in said other path and divert current to said one path, said output means having a greater time constant than said input means, whereby when said current is interrupted said input means ceases to impede current in said other path, and thereafter said output means establishes a persistent current condition through both paths in said loop, and means in the magnetic fields of one of said paths for detecting said persistent current.

5. An electrical circuit comprising current input and output terminals, superconductive means forming a closed loop providing at least two current carrying paths between said terminals, one of said paths forming inductive output means, input means for impeding current in the other of said paths, said input means being connected in series with one of said terminals, said paths being magnetically independent of each other so that said circuit may assume a condition in which current flows in both paths, an interruptive current connection to one of said terminals, whereby current may be supplied through said terminal means and input means thereby to impede current in said other path and divert current to said one path, said output means having a greater time constant than said input means, whereby when said current is interrupted said input means ceases to impede current in said other path, and thereafter said output means establishes a persistent current in said loop, control means for applying a magnetic field to said loop, and switching means for applying current to said control means thereby to quench said persistent current.

6. An electrical circuit comprising at least two closed loops, each loop including at least two magnetically independent, superconductive current carrying paths and inductive output means in one path, for each other path of the loop respectively, at least two input means for impeding current in said other path, current input and output terminals for the paths of each loop, means connecting at least two input means, one for each loop, in series with one of the terminals for the loops respectively, and an interruptive current connection to said connecting means, whereby, when current is supplied through the connecting means for one loop, current flows in one input means of each loop thereby impeding current in said other path of each loop, and current is supplied to the inductive output of one loop, said inductive output having a greater time constant than said input means, whereby when said current connection is interrupted said input means ceases to impede current in the other path of said loop, and thereafter the output means of said one loop establishes a persistent current in said loop through both paths of said loop.

7. An electrical circuit comprising superconductive means forming at least two, magnetically independent, current carrying paths, current input and output terminals for said paths, one of said paths forming inductive means, input means for impeding current in the other of said paths, said input means being connected in series with one of said terminals, and current detecting means in the magnetic field of at least one of said paths.

8. The circuit according to claim 7 characterized by means for quenching persistent current in said paths independently of said input means.

References Cited in the file of this patent

UNITED STATES PATENTS

| | | |
|---|---|---|
| 2,832,897 | Bucks | Apr. 29, 1958 |
| 2,877,448 | Nyberg | Mar. 10, 1959 |
| 2,913,881 | Garwin | Nov. 24, 1959 |
| 2,977,575 | Hagelbarger et al. | Mar. 28, 1961 |
| 3,001,179 | Slade | Sept. 19, 1961 |
| 3,060,323 | Nyberg | Oct. 23, 1962 |

OTHER REFERENCES

"Some Experiments on a Supraconductive Alloy in a Magnetic Field," by J. M. Casimir-Jonker and W. J. DeHaas, Physica, vol. 2, 1955, pp. 935–941.

"A Cryotron Catalog Memory System," by A. E. Slade and H. O. McMahon in Eastern Joint Computer Conference, pp. 115–120, December 10–12, 1956.

"A Review of Superconductive Switching Circuits," A. E. Slade and H. O. McMahon, National Electronic Conference, vol. XIII, Oct. 7–9, 1957.